(12) United States Patent
Rassaian et al.

(10) Patent No.: US 9,665,976 B2
(45) Date of Patent: *May 30, 2017

(54) REDUCING FINITE ELEMENT SIMULATION TIME BY REDUCING CROSS-CORRELATION TERMS

(75) Inventors: Mostafa Rassaian, Bellevue, WA (US); Thomas T. Arakawa, Renton, WA (US); Jeffery S. Knowlton, Kent, WA (US)

(73) Assignee: The Boeing Company, Chicago, IL (US)

( * ) Notice: Subject to any disclaimer, the term of this patent is extended or adjusted under 35 U.S.C. 154(b) by 422 days.

This patent is subject to a terminal disclaimer.

(21) Appl. No.: 12/137,389

(22) Filed: Jun. 11, 2008

(65) Prior Publication Data
US 2009/0105996 A1 Apr. 23, 2009

Related U.S. Application Data

(63) Continuation of application No. 11/089,182, filed on Mar. 23, 2005, now Pat. No. 7,430,499.

(51) Int. Cl.
*G06F 7/60* (2006.01)
*G06F 17/10* (2006.01)
*G06T 17/20* (2006.01)
*G06F 17/50* (2006.01)

(52) U.S. Cl.
CPC .......... *G06T 17/20* (2013.01); *G06F 17/5018* (2013.01)

(58) Field of Classification Search
USPC ............................................. 703/2
See application file for complete search history.

(56) References Cited

U.S. PATENT DOCUMENTS 6,090,147 A * 7/2000 Bremner et al. .......... 703/1

OTHER PUBLICATIONS

R. Le. Letty, . Claeyssen, N. Lhermet, B.Hamonic, J.N. Decarpigny, and R. Bossut. "Combined Finite Element-Normal Mode Expansion methods in Electroelasticity and their Application to Piezoactive Motors" 1997. John Wiley & Sonds, LTD. International Journal for Numerical Methods in Engineering, vol. 40, 3385-3403.*

(Continued)

*Primary Examiner* — Ben Rifkin
(74) *Attorney, Agent, or Firm* — Miller, Matthias & Hull LLP (57) ABSTRACT

Methods and systems for reducing finite element simulation time for acoustic response analysis are disclosed. In one embodiment, a method includes analytically creating a finite element model, the finite element model including a plurality of subdivisions. A plurality of cross-correlations between respective pairings of the subdivisions is then specified. A portion of the cross-correlations are then eliminated to provide a reduced set of cross-correlations between respective pairings of the subdivisions. The elimination includes determining a spatial distance value between at least two subdivisions, and discarding at least one of the cross-correlations for which the spatial distance value is greater than a specified threshold value. The finite element simulation is then performed using the reduced set of cross-correlations.

7 Claims, 5 Drawing Sheets

(56) References Cited

OTHER PUBLICATIONS

Marc E. Kowalski, Jian-Ming Jin. "Model-Order Reuction of Nonlinear Models of Electromagnetic Phased-Array Hyperthermia" Nov. 2003. IEEE Transactions on Biomedical Engineering, vol. 50, No. 11. p. 1243-1254.*

Stavrinidis, C. M. Witting, and M. Klein. "Advancements in Vibroacoustic Evaluation of Satellite Structures" [Online] Downloaded Jan. 12, 2011. Acta Astronautica vol. 48 No. 4 pp. 20-3210, 2001. http://www.sciencedirect.com/science?_ob=MImg&_imagekey=B6V1N-42SXFDX-3-18&_cdi=5679&_user=2502287&_pii=S0094576500001235&_origin=search&_coverDate=02%2F28.*

Grosveld, Ferdinand. "Plate Accelration and Sound Transmission Due to Random Acoustic and Boundary-Layer Excitation" [Online] Downloaded Jan. 13, 2011. AIAA Journal. vol. 30, No. 3, Mar. 1992 http://grosveld.com/publications/JAIAA-30-03.pdf.*

J. Woodhouse, "An Introduction to Statistical Energy Analysis of Structural Vibration" Applied Acoustics 0003-682X/81/0014-0455 (1981).

* cited by examiner

| TBL ANALYSIS TYPE | THRESHOLD CUTOFF | CPU RUN TIME (MIN.) | |
|---|---|---|---|
| UNREDUCED | NONE | 20.4 | ←—702 |
| REDUCED | 0.01 | 4.7 | ←—704 |
| REDUCED | 0.10 | 3.3 | ←—706 |

REDUCING FINITE ELEMENT SIMULATION TIME BY REDUCING CROSS-CORRELATION TERMS

CROSS REFERENCE TO RELATED APPLICATIONS

This patent application is a divisional application of co-pending, commonly-owned U.S. patent application Ser. No. 11/089,182 entitled "Methods and Systems for Reducing Finite Element Simulation Time For Acoustic Response Analysis" filed on Mar. 23, 2005, which application is incorporated herein by reference.

FIELD OF THE INVENTION

This invention relates to computer simulations, and more specifically, to methods and systems for reducing simulation time for finite element analyses, including acoustic response analyses.

BACKGROUND OF THE INVENTION

Conventional finite element analysis of structural responses to partially correlated acoustic waves is computationally intensive. For example, conventional methods of analyzing aircraft cabin noise levels have involved simulations of a coupled structure and fluid media model. This approach requires separate structural analysis using finite element modeling (FEM) and computational fluid dynamics (CFD) models to interact via structural displacement and cavity pressure, which typically requires extensive modeling and lengthy computational time.

Although desirable results have been achieved using such conventional methods, there is room for improvement. Specifically, conventional finite element analyses of structural responses to partially correlated acoustic waves typically involve large amounts of data that may exceed built-in limits of the finite element software and hardware tools. Also, the extensive computational times required may be prohibitively expensive

SUMMARY OF THE INVENTION

The present invention is directed to methods and systems for reducing simulation time for finite element analyses, including finite element acoustic response analysis. Embodiments of methods in accordance with the present invention may advantageously allow the sizes of such computational simulations to be reduced to manageable levels, thereby reducing the computational times and associated costs required for achieving such solutions without compromising accuracy of the overall response.

In one embodiment, a method of performing a finite element simulation includes analytically creating a finite element model, the finite element model including a plurality of subdivisions. A plurality of cross-correlations between respective pairings of the subdivisions is then specified. A portion of the cross-correlations are then eliminated to provide a reduced set of cross-correlations between respective pairings of the subdivisions. The elimination includes determining a spatial distance value between at least two subdivisions, and discarding at least one of the cross-correlations for which the spatial distance value is greater than a specified threshold value. The finite element simulation is then performed using the reduced set of cross-correlations. In a particular embodiment, the finite element model is a model of a structural response to an acoustic excitation.

BRIEF DESCRIPTION OF THE DRAWINGS

Preferred and alternate embodiments of the present invention are described in detail below with reference to the following drawings.

DETAILED DESCRIPTION

The present invention relates to methods and systems for reducing simulation time for finite element analyses, including finite element acoustic response analysis. Many specific details of certain embodiments of the invention are set forth in the following description and in FIGS. 1-8 to provide a thorough understanding of such embodiments. The present invention may have additional embodiments, or may be practiced without one or more of the details described for any particular described embodiment.

Generally speaking, conventional finite element analysis of structural responses to acoustic waves involves the specification of mathematical relationships (called "cross-correlations") between a large number of possible pairings of subdivisions of a panel that has been analytically subdivided for the purpose of analysis. In many situations, however, a significant number of these cross-correlations can be removed from the analysis with acceptable effect (or uncertainty) on the final answers. The following description sets forth methods for reducing problem sizes of such simulations by eliminating some of the cross-correlation terms, with an estimate of the error introduced by the omission of these terms. In at least some analysis cases, a large number of cross-correlation terms can be eliminated with an acceptably small effect on the accuracy of the final answers.

Figure 1:
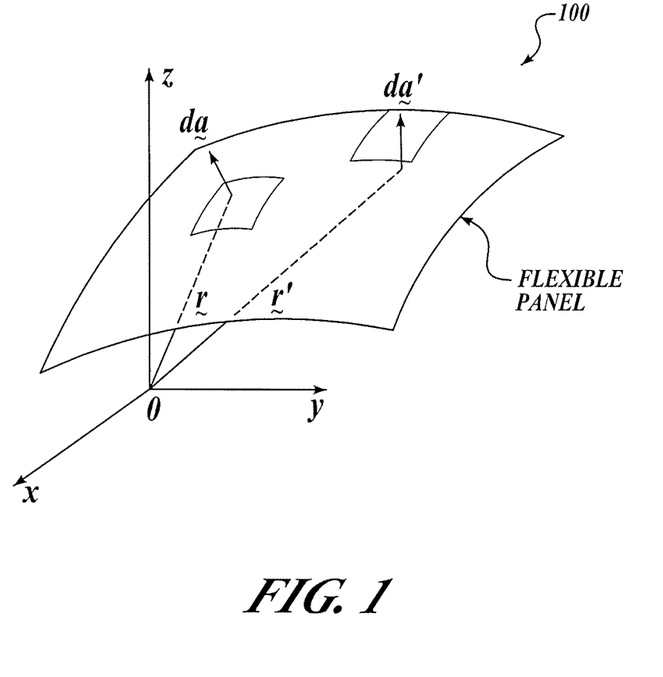
FIG. 1 is a representative panel to be modeled using a finite element method in accordance with an embodiment of the invention.

More specifically, in at least some embodiments, cross-correlation means that the pressure at a point x is multiplied with that at a different point x' taken at a time t later, and averaged over time, or in general the points x and x' can be replaced with position vectors r, r' respectively. For example, FIG. 1 is a representative plate (or panel) 100 to be modeled using a finite element method in accordance with an embodiment of the invention. Study of structural response to acoustic excitation shows that, if the mode shape $\Phi(r)$ and the critical damping ratio $\xi$ are known, prediction of the response essentially reduces to a determination of the joint acceptance $J(\omega)$ of the structural element with the pressure field.

The joint acceptance function, $J(\omega)$ is defined by $$J_{jm}(\omega) = \frac{1}{A^2} \int_a \int_{a'} C(\underline{r}, \underline{r}', \omega) \phi_j(\underline{r}) \varphi_m(\underline{r}') d\underline{a} d\underline{a}' \tag{1}$$

where $d\underline{a}\, d\underline{a}'$=infinitesimal area vectors $C(\underline{r}, \underline{r}', w)$=cross-power spectral density coefficient of the sound pressure field $A$=pressure surface area $\underline{r}, \underline{r}'$=space vectors locating points on the structure and $\omega = 2\pi f$, where f is the frequency of the acoustic excitation in Hz.

The joint acceptance function describes the coupling between an excitation pressure field and a structure represented by its normal vibration modes. $J_{jm}(\omega)$ is computed by mapping of the differential elements in integration space using a Jacobi method at the integrated degrees of freedom. The physical response spectral density (i.e., displacement, acceleration, stress, strain) may be computed using a cross-correlation function.

If an acoustic wave impinges normal to the plate 100, the plane wave (fully correlated) is considered as the type of pressure field. The input spectrum can be either pressure in psi$^2$/Hz or sound pressure level in dB. For the latter, sound pressure level is first converted into pressure following the formula $$G(f) = 8.41 \times 10^{\left(\frac{SPL}{10} - 18\right)} / \Delta f \tag{2}$$

where
$\Delta f = (2^{1/6} - 2^{-1/6}) f_c$ for ⅓ octave band
and
$\Delta f = (2^{1/2} - 2^{-1/2}) f_c$ for 1 octave band Alternately, for the case of general acoustic waves, which may be partially correlated and uncorrelated, consider the joint acceptance function for homogeneous pressure fields given by $$C(\underline{r}, \underline{r}', \omega) = C(\underline{r} - \underline{r}', \omega) \tag{3}$$

so that Equation (1) can be written as $$J_{jm}(\omega) = \int_a \int_{a'} C(\underline{r} - \underline{r}', \omega) \varphi_j(\underline{r}) \varphi_m(\underline{r}') d\underline{a} d\underline{a}' \tag{4}$$

Note that for a fully correlated wave, the cross-correlation function C is unity. The following kernel can accommodate both fully correlated and partially correlated waves, allowing for coherence variations in transverse and longitudinal directions for a variety of circumstances, including, for example, plane wave, progressive, and turbulent boundary layers:

$$C(\xi, \eta, \omega) = G(\omega) \exp\left\{ -\frac{|\xi|}{\lambda_\xi(\omega)} - \frac{|\eta|}{\lambda_\eta(\omega)} - i\frac{\omega \xi}{U_\xi} \right\} \text{ where} \tag{5}$$

$\xi = (\underline{r} - \underline{r}')|_x$=Spatial distance in x direction $\eta = (\underline{r} - \underline{r}')|_y$=Spatial distance in y direction $\lambda_\xi, \lambda_\eta$=Correlation scale along $\xi$ and $\eta$ $U_\xi$=Convective velocity along $\xi$.

For a reverberant wave, the coherence function can be re-written as $C(\underline{r}, \omega) = G(\omega) \sin(kr)/(kr)$ where $\underline{r} = \xi \underline{i} + \eta \underline{j}$ and $k$ is wave number$= \omega/c$ \hfill (6)

where G appearing in Equations (5) and (6) represents sound pressure level (SPL) in dB. It can also represent pressure PSD as related to SPL via Equation (2).

For moderate size problems with thousands of elements, it may take hours or even days to perform a full element-by-element analysis. To reduce computational time, instead of performing the integration element by element, the area of integration is divided into a small number of sub-domains. The integration may then be performed based on the few sub-partitions.

A progressive wave can be deduced from the general turbulent boundary layer (TBL) if both correlation scale factors in Equation (5) take on large numbers. Similarly, a plane wave is reduced from a progressive wave if the convective velocities assume large numbers.

Furthermore, a method of modal superposition for the solution of certain problems (e.g. a TBL) may be implemented by integrating the cross-correlation function as shown below in Equation (7):

$$C(\xi, \eta, \omega) = G(\omega) \exp\left\{ -\frac{|\xi|}{\lambda_\xi(\omega)} - \frac{|\eta|}{\lambda_\eta(\omega)} - i\frac{\omega \xi}{U_\xi} \right\} \text{ where} \tag{7}$$

$\xi = (\underline{r} - \underline{r}')|_x$=Spatial distance in x direction $\eta = (\underline{r} - \underline{r}')|_y$=Spatial distance in y direction $\lambda_{86}, \lambda_\eta$=Correlation scale along $\xi$ and $\eta$ $U_\xi$=Convective velocity along $\xi$.

The relative magnitudes of the spatial spacing and correlation factor in x and y directions provide the necessary information for construction of a reduced computing procedure, as described more fully below. For a small value $\epsilon$ ($\ll 1$), lets consider the first exponent term that involves $\lambda_\xi$ (assume $\lambda_\xi < \lambda_\eta$) such that:

$$\exp\left\{ -\frac{|\xi|}{\lambda_\xi(\omega)} \right\} < \varepsilon$$

By taking natural log of this inequality we have $-|\xi| < \ln \epsilon \lambda_\xi(\omega)$ This can be rewritten in a more practical form for finite element implementation, as follows:

$|\xi| > |\ln \epsilon| \overline{\lambda}_\xi$ \hfill (8)

where $\overline{\lambda}_\xi = \min\{\lambda_\xi(\omega)\}$ \hfill (9)

The relationships defined above provide a basis for reducing analysis run time by discarding those elements that fall outside a specified distance given by the threshold value $\epsilon$. The specified (spatial) distance is the distance between the two respective subdivisions involved in the cross-correlation calculation. The rationale for improving the computational time that involves a partially correlated acoustic field as expressed by Equation 7 starts with a typical term as a component of Equation 7 which has been examined by the first inequality. Note that epsilon ($\epsilon$) is a small tolerance quantity that can specify how small the overall error to the resulting stress can be tolerated. That means the smaller epsilon ($\epsilon$), the less opportunity to reduce the CPU time since the total number of subdivision that can be removed becomes smaller compared to a case with a large epsilon. The derivation of the equations leads to the last inequality given by Equation 8 which forms a basis for a numerical condition by which a subdivision can be eliminated if its distance from a reference subdivision exceeds a value determined by the right-hand-side of Equation 8. $\overline{\lambda}_\xi$ (the left hand side of Equation 9) is the minimum scale density factor in the xsi ($\zeta$) direction over the frequency range of the analysis. This method can be extended to the orthogonal direction and is applicable for structural response to acoustic fields with decay, including, for example, a progressive wave and a turbulent boundary layer.

Figure 2:
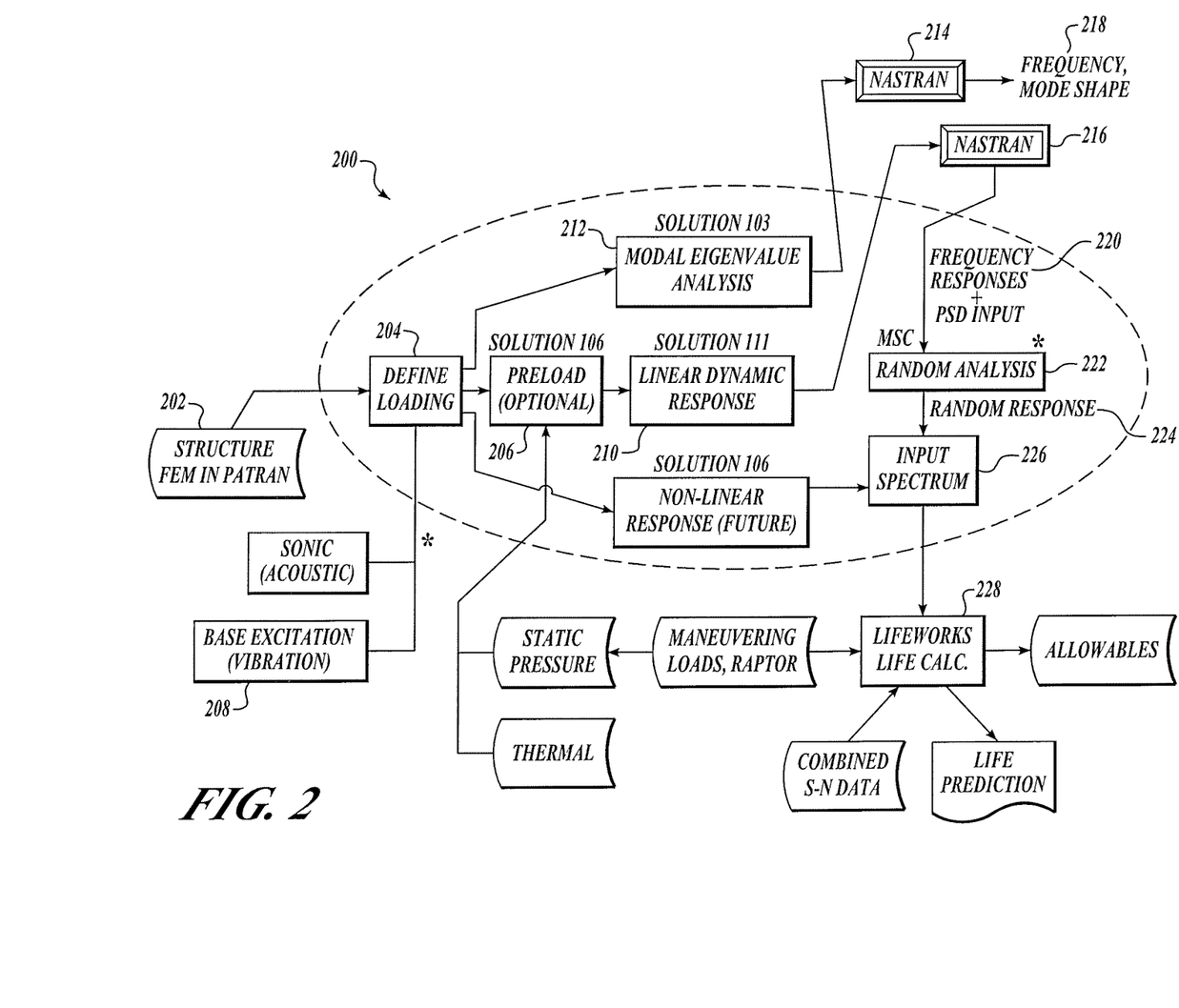
FIG. 2 is a flow chart of a method of performing finite element simulations of a structural response to an acoustic wave in accordance with an embodiment of the invention.

The above-noted basis for reducing analysis run times may be implemented in methods for performing finite element simulations of a structural response to an acoustic input. For example, FIG. 2 is a flow chart of a method 200 of performing finite element simulations in accordance with an embodiment of the invention. The method 200 starts at a block 202 with a predefined finite element model using a suitable finite element method program such as, for example, PATRAN. In brief, PATRAN is a publicly-available, pre-, post-processor product from MSC Software for modeling and setting up a finite element analysis job and for analyzing the linear static and/or dynamic response of solids, shells, and beams elements. Likewise, NASTRAN, another publicly-available product from MSC may be used as the finite element solver. Additional information of the capabilities of PATRAN and NASTRAN can be found at the MSC software site www.mscsoftware.com which is incorporated by reference.

The acoustic load case for input into the finite element solver is specified at a block 904. The finite element model at block 206 may include structural preload information, as well as thermal preload information (e.g. nodal temperature data). In one embodiment, the thermal preload information may be input from results from a computer program such as TOPAZ3D, a fully-implicit three-dimensional finite element analysis code for heat transfer analysis which can be used to solve the steady-state or transient temperature field on three-dimensional geometries, available from the Lawrence Livermore National Laboratory.

As further shown in FIG. 2, at block 208, a power spectral density (PSD)-frequency source is provided as load condition input into the finite element program. The frequencies from this file is used to override the default input forcing frequency range and to establish the loadcase identification and most importantly, for invoking the reduction algorithm. At block 208, one primary concern involves the acoustic type input (e.g. progressive wave, TBL) for the reduction simulation. The method 200 gathers these inputs and at blocks 210 and 212 generates the input files for the dynamic response solution 111 and optional eigenvalue solution 103. The finite element code (e.g. NASTRAN) is then run for these solutions at blocks 214 and 216, respectively. The natural frequencies and mode shapes 218 are recorded after the eigenvalue solution is performed. This is reviewed for soundness and predicted behavior of the dynamics model. To proceed with the random analysis (block 222), the frequency response from the NASTRAN solution 111 run (block 220) is combined with the random input PSD load (from block 208). If a reduction parameter ($\epsilon$) was specified, this is where a reduction in process simulation time may be noticed and measured. The random PSD and RMS responses (block 224) may be reviewed visually using block 200's post-processing capabilities. The random analysis uses the MSC engine called MSC Random available as a shareware in the PATRAN product to compute the PSD and rms values at the block 224.

Figure 3:
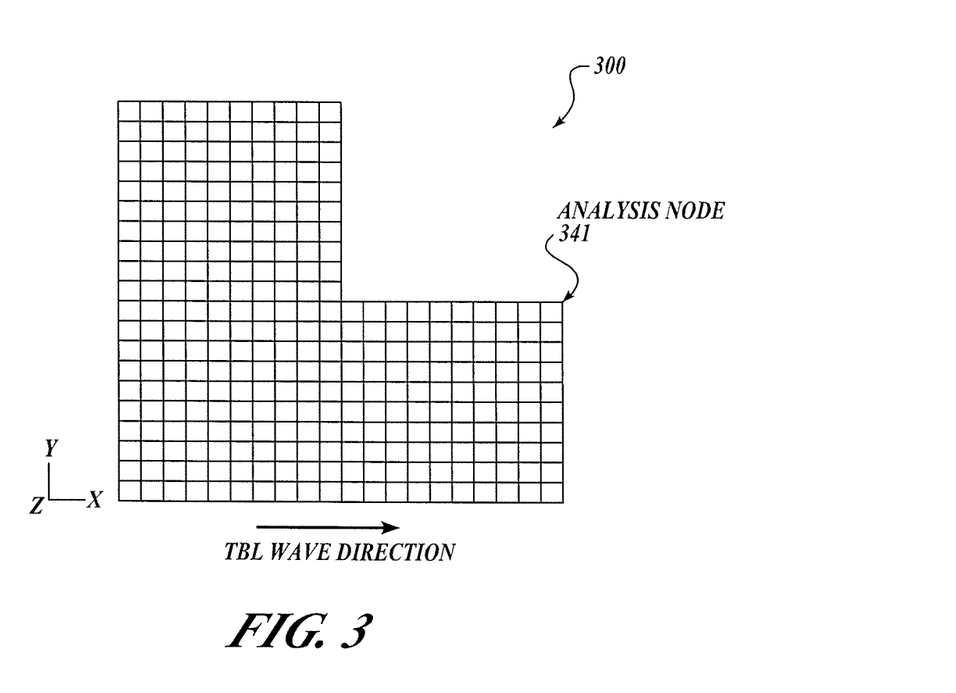
FIG. 3 is an embodiment of an L-shape FEM problem.
Figure 4:
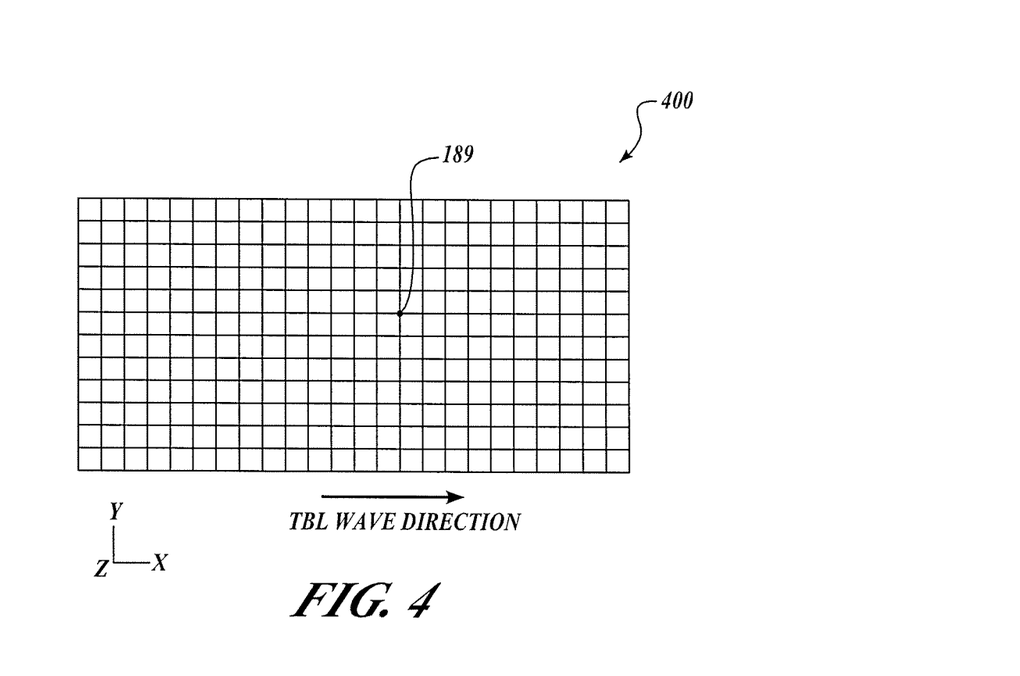
FIG. 4 is an embodiment of a rectangular FEM problem.

To illustrate the advantages of methods in accordance with the present invention, two example problems will be described below. The first example problem is an "L" shaped panel (FIG. 3), and the second example problem is a rectangular panel (FIG. 4). With reference to FIG. 3, in this particular embodiment, the L-shaped panel 300 was modeled using a 10"×10" L-Shape flat plate model consisting of three hundred shell elements. The L-shaped panel 300 was clamped along three edges. An analysis node 341 at a corner of a free-edge was selected as an evaluation point where the maximum acceleration (Z) response occurs. A TBL file defining a loading profile across a frequency range (e.g. 25-2500 Hz) was used as input to a finite element solver suitably modified in accordance with the teachings of the present disclosure. In this example problem, the solution was expanded to 10 modes or 2500 Hz, whichever occurred first. A conventional finite element solver which was not modified in accordance the teachings of the present disclosure was also run on the same problem for comparison purposes.

Figure 5:
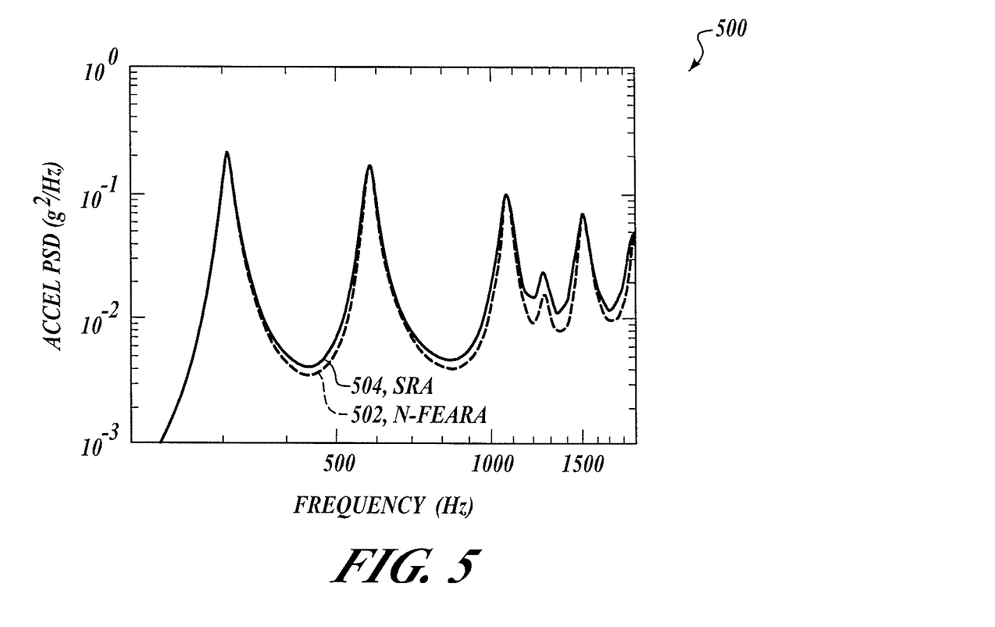
FIG. 5 is a graph showing simulation results for the L shape panel of FIG. 3.

FIG. 5 is a graph 500 showing a comparison of the acceleration (Z) simulation results for the L shape panel from the conventional finite element solver 502 and the modified finite element solver 504 in accordance with the present invention. For example, in one particular embodiment, the conventional finite element solver may be based on the Boeing-developed tool for high-cycle fatigue called N-FEARA which is a NIKE3D-based Finite Element Acoustic Response Solver from Lawrence Livermore National Labs. In another particular embodiment, the modified finite element solver may be based on a program known as PATRAN-MSC Random, a three dimensional finite element solver available from MSC Software Corporation of Santa Ana, Calif. Comparison of the acceleration Z response at the analysis node 341 resulted in relatively close agreement along the selected frequency spectrum. The response from the conventional finite element solver 502 (shown in dotted lines) was sensitive to a number of log intervals (NF) specified in an input file used for defining the excitation frequency input (solution points). The coarseness of the modified finite element solver 504 (shown in solid lines) may be attributed to the sensitivity of this value especially in the trough regions.

Embodiments of modified finite element solvers in accordance with the present invention may provide suitable simulation results (FIG. 5) using less computational resources in comparison with prior art finite element solvers. More specifically, in the particular embodiment where the conventional finite element solver 502 is based on the N-FEARA program, and the modified finite element solver 504 is based on PATRAN, the simulations of the L shaped panel 300 using the modified finite element solver 504 were faster than the simulations using the conventional finite element solver 502 by a factor of approximately four to six times or even higher depending on the specified tolerance (see FIG. 7).

Referring again to FIG. 4, the rectangular plate model 400 was analyzed using a 10"×20" model consisting of two hundred shell elements simply-supported along all edges. An analysis node 189 was identified to monitor responses on the model, and displacement and velocity outputs in a Z direction were requested.

Figure 6:
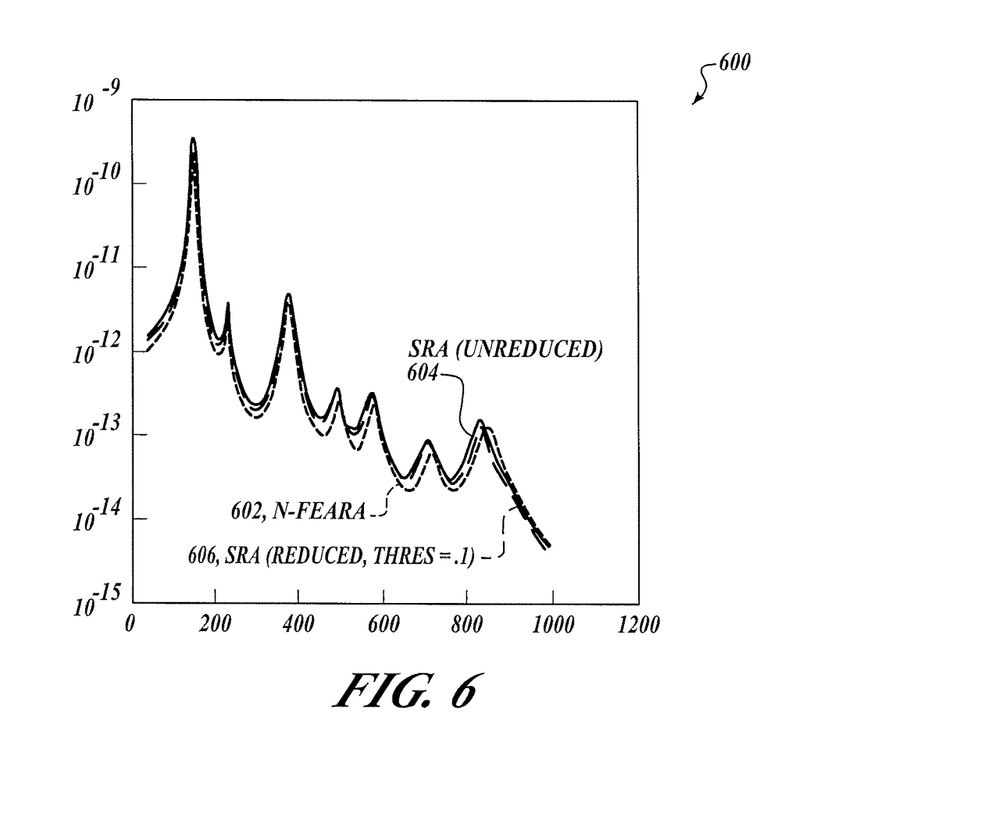
FIG. 6 is a graph showing simulation results for the rectangular panel of FIG. 4.

FIG. 6 is a graph 600 showing simulation results for the rectangular panel 400 of FIG. 4. In this embodiment, three simulations were performed. Specifically, a first simulation 602 was performed using a conventional finite element solver based on N-FEARA, and a second simulation 604 was performed using a conventional finite element solver based on PATRAN MSC Random. Also, a third simulation 606 was performed using the PATRAN-based finite element solver modified in accordance with the teachings of the present disclosure to include the reduction scheme set forth in Equations (7) through (9). In this example, the third simulation was performed using a threshold value of $\epsilon=0.1$. The three solutions were solved up to ten modes or 1000 Hz, whichever occurred first. Also the NF=100 setting was used as solution frequency points in the PATRAN-based finite element solvers for obtaining smoother and more accurate response curves. Also, for this example, both the convention and modified finite element solvers used one hundred forty four partitions. The simulation data shown in FIG. 6 suggest that modified finite element solvers in accordance with the present invention may provide suitably accurate simulation results 606.

Figure 7:
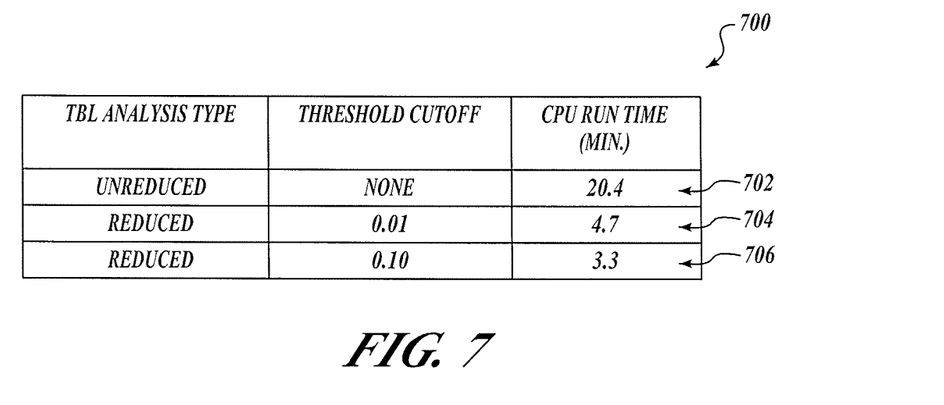
FIG. 7 is a table showing computational simulation times for various threshold cutoff values $\epsilon$ in accordance with alternate embodiments of the invention.

FIG. 7 is a table 700 showing computational simulation times for performing the simulation of the rectangular plate 400 using the modified finite element solver with various threshold cutoff values $\epsilon$. More specifically, the table 700 shows a first simulation time 702 for an unreduced TBL analysis (i.e. a threshold value of $\epsilon=0$), a second simulation time 704 for a reduced TBL analysis computed using a threshold value of $\epsilon=0.01$, and a third simulation time 706 for a reduced TBL analysis computed using a threshold value of $\epsilon=0.1$. In this particular embodiment, the first simulation time 702 corresponds to the second simulation results 604 shown in FIG. 6, while the third simulation time 706 corresponds to the third simulation results 606 shown in FIG. 6. Generally, the simulation times shown in FIG. 7 show that computational simulation times are reduced using the modified finite element solver in comparison with the conventional finite element solver. More specifically, for this particular example, comparison of the first and third simulation times 702, 706 show that the simulation time may be reduced by a factor of six by using the threshold cutoff value $\epsilon=0.1$ in comparison with the conventional, unreduced simulation procedure. Thus, embodiments of the present invention may advantageously allow the sizes of computational simulations to be reduced, thereby reducing the computational times and associated costs required for achieving such solutions without compromising accuracy. In addition to reducing the cost of such simulations, the flow time of such analyses may be improved.

Figure 8:
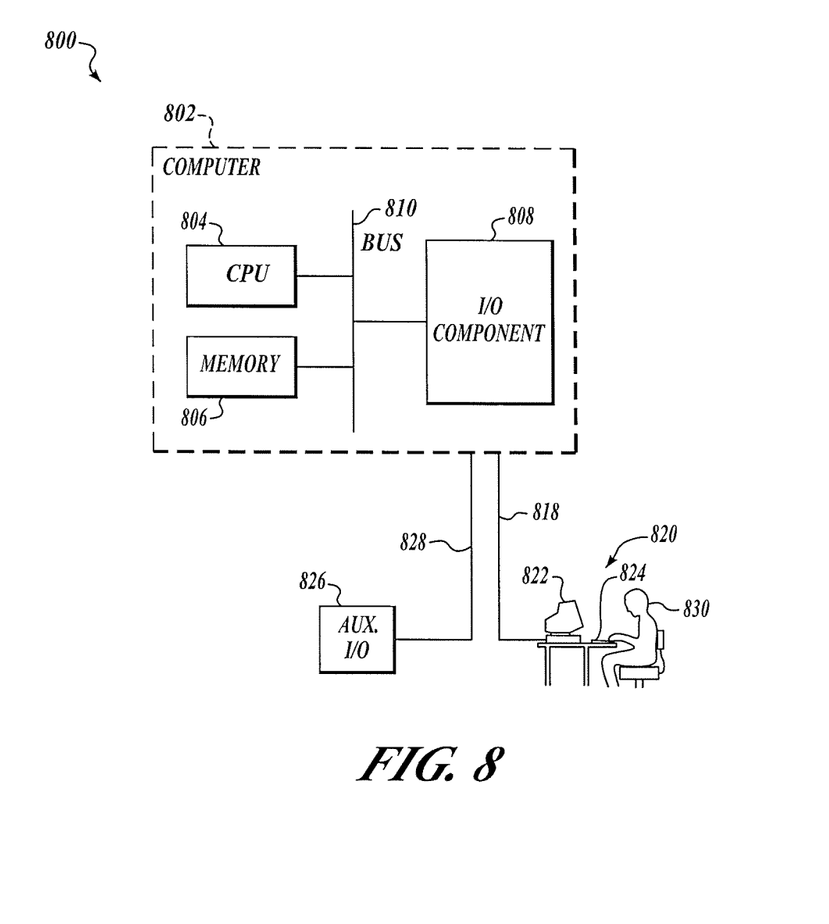
FIG. 8 is a system for performing finite element simulations in accordance with another embodiment of the invention.

FIG. 8 is a system 800 for performing finite element simulations in accordance with another embodiment of the invention. Unless otherwise specified, the components of the system 800 are of generally-known construction, and for the sake of brevity, will not be described in detail. In this embodiment, the system 800 includes a computer 802 having a central processing unit (CPU) 804 and a memory component 806. The memory component 806 may include one or more memory modules, such as Random Access Memory (RAM) modules, Read Only Memory (ROM) modules, Dynamic Random Access Memory (DRAM) modules, and any other suitable memory modules. The computer 802 also includes an input/output (I/O) component 808 that may include a variety of known I/O devices, including network connections, video and graphics cards, disk drives or other computer-readable media drives, displays, or any other suitable I/O modules. A data bus 810 operatively couples the CPU 804, memory component 806, and the I/O component 808.

As further shown in FIG. 4, the system 800 further includes a control component 820 having a monitor 822 and a command input device 824 (e.g. a keyboard, an audio-visual input device, etc.). A communication link 818 operatively couples the control component 820 to the computer 802. In this embodiment, the system 800 also includes an auxiliary output device 826 coupled to the computer 802 by a second communication link 428. The auxiliary output device 826 may include, for example, a printer, a compact disk (CD) burner, a storage device, a communication port, or any other desired output device.

In one aspect, a machine-readable medium may be used to store a set of machine-readable instructions (e.g. a computer program) into the computer 802, wherein the machine-readable instructions embody a method of performing finite element analyses in accordance with the teachings of the present invention, including the described method 200 depicted in FIG. 2. The machine-readable medium may be any type of medium which can store data that is readable by the computer 802, including, for example, a floppy disk, CD ROM, optical storage disk, magnetic tape, flash memory card, digital video disk, RAM, ROM, or any other suitable storage medium. The machine-readable medium, or the instructions stored thereon, may be temporarily or permanently installed in any suitable component of the system 800, including, for example, the I/O component 808, the memory component 806, and the auxiliary output device 826. Alternately, the machine-readable instructions may be implemented directly into one or more components of the computer 802, without the assistance of the machine-readable medium. In still other embodiments, one or more aspects of the various processes described may be implemented in the computer 402 using any suitable programmable or semi-programmable hardware components (e.g. EPROM components).

In operation, the computer 802 may be configured to perform one or more of the aspects of the methods of performing finite element simulations described above. For example, an operator 830 may input one or more appropriate commands through the command input device 824 to set up a finite element simulation, and to command the performance of finite element simulations in accordance with the present invention. Results of such analyses may then be transmitted via the data bus 810 to the I/O component 808. The results may also be transmitted to the control component 820 and to the auxiliary output device 826 via the communications links 818 and 828. The operator 830 may then view the results of the analysis method(s) on the control monitor 822, and may take appropriate action, including comparing the simulation results with other simulation or test data, revising analysis parameters and inputs, and continuing or repeating the simulations as desired.

While preferred and alternate embodiments of the invention have been illustrated and described, as noted above, many changes can be made without departing from the spirit and scope of the invention. Accordingly, the scope of the invention is not limited by the disclosure of these preferred and alternate embodiments. Instead, the invention should be determined entirely by reference to the claims that follow.

What is claimed is:

1. A system comprising a computer programmed to:
create a finite element model of a structural response to an acoustic field with decay, the model including a surface partitioned into a plurality of subdivisions, and cross-correlation loading terms for the subdivisions; and
reduce the cross-correlation loading terms by eliminating those terms for each subdivision that exceeds a computed spatial distance from adjacent subdivisions, where the computed distance indicates how far apart a subdivision can be without being influenced by cross-correlation loading of the adjacent subdivisions, where the spatial distance is a function of a minimum scale density factor over frequency range of the analysis.

2. The system of claim 1, wherein the spatial distance is computed and considered for each of x and y directions.

3. The system of claim 2, wherein the spatial distance is computed as a product of a scalar factor and the minimum scale density factor in each direction.

4. The system of claim 3, wherein the scalar factor is |ln ε| where threshold ε≪1 and wherein the minimum scale density factor is the minimum value of spatial distance over the frequency range in each direction.

5. The system of claim 1, wherein the cross-correlation loading terms are computed as $$C(\xi, \eta, \omega) = G(\omega)\exp\left\{-\frac{|\xi|}{\lambda_\xi(\omega)} - \frac{|\eta|}{\lambda_\eta(\omega)} - i\frac{\omega\xi}{U_\xi}\right\} \text{ where}$$

$\xi=(\underline{r}-\underline{r}')|_x$=Spatial distance in x direction;

$\eta=(\underline{r}-\underline{r}')|_y$=Spatial distance in y direction;

$\lambda_\xi, \lambda_\eta$=Correlation scale along $\xi$ and $\eta$;

$U_\xi$=Convective velocity along $\xi$; and $G(\omega)$=sound pressure.

6. The system of claim 1, wherein the partially correlated acoustic field is a turbulent boundary layer pressure field.

7. The system of claim 1, wherein the computer is further programmed to perform a finite element analysis with the reduced cross-correlation loading terms.

* * * * *